United States Patent
Lütze et al.

(10) Patent No.: US 9,711,952 B2
(45) Date of Patent: Jul. 18, 2017

(54) MOUNTING SYSTEM FOR ARRANGING ELECTRIC DEVICES IN SWITCHGEAR CABINETS

(71) Applicant: Friedrich Lütze GmbH, Weinstadt-Grossheppach (DE)

(72) Inventors: Udo Lütze, Kernen-Stetten (DE); Jürgen Lang, Ludwigsburg (DE); Virgil Ghizelea, Stuttgart (DE)

(73) Assignee: FRIEDRICH LUETZE GMBH, Weinstadt-Grossheppach (DE)

( * ) Notice: Subject to any disclaimer, the term of this patent is extended or adjusted under 35 U.S.C. 154(b) by 0 days.

(21) Appl. No.: 14/416,717

(22) PCT Filed: Jul. 25, 2013

(86) PCT No.: PCT/EP2013/002209
§ 371 (c)(1),
(2) Date: Jan. 23, 2015

(87) PCT Pub. No.: WO2014/015987
PCT Pub. Date: Jan. 30, 2014

(65) Prior Publication Data
US 2015/0188298 A1    Jul. 2, 2015

(30) Foreign Application Priority Data

Jul. 25, 2012 (DE) .................. 10 2012 014 980

(51) Int. Cl.
*H02B 1/01*   (2006.01)
*H02B 1/20*   (2006.01)
(Continued)

(52) U.S. Cl.
CPC ............ *H02B 1/052* (2013.01); *H02B 1/011* (2013.01); *H02B 1/012* (2013.01); *H02B 1/202* (2013.01); *H02B 1/34* (2013.01); *H05K 7/183* (2013.01)

(58) Field of Classification Search
CPC .......... H02B 1/34; H02B 1/011; H02B 1/012; H02B 1/052; H02B 1/20; H02B 1/202;
(Continued)

(56) References Cited

U.S. PATENT DOCUMENTS 4,334,372 A * 6/1982 Colmar ............. G09F 3/20
40/5
4,446,640 A * 5/1984 Kenney ............. G09F 3/20
40/615
(Continued)

FOREIGN PATENT DOCUMENTS

DE   297 16 229 U1   10/1997
DE   199 08 350 A1    8/2000
(Continued)

*Primary Examiner* — Michael Safavi
(74) *Attorney, Agent, or Firm* — Wenderoth, Lind & Ponack, L.L.P.

(57) ABSTRACT

A mounting system (1) for arranging electric devices (2), for example switchgear cabinets, includes at least one preferably horizontal mounting strip (3) to which at least one device (2) can be secured. The mounting strip (3) includes a support rail (6) to which the device (2) can be releasably fastened and located in a first section (41) of the mounting strip. The first section is central in relation to a cross-sectional view through the mounting strip (3), transversely to its longitudinal axis. A third section (43) of the mounting strip located at a distance from the support rail (6) is at a greater vertical distance (44) from the bottom point (39) of the support rail (6) than a second section (42) at its end that is closer to the support rail (6), especially its end adjoining (Continued)

the support rail (6). The second section is located between the first section (41) and the third section (43).

26 Claims, 11 Drawing Sheets

(51) Int. Cl.
    *H02B 1/34*      (2006.01)
    *H05K 7/18*      (2006.01)
    *H02B 1/052*      (2006.01)

(58) Field of Classification Search
    CPC . H02B 1/21; H02B 1/22; H02B 1/205; H05K 7/142; H05K 7/183
    USPC ............. 361/627, 637, 640; 174/95, 97
    See application file for complete search history.

(56) References Cited

U.S. PATENT DOCUMENTS

| | | | | |
|---|---|---|---|---|
| 4,593,824 A * | 6/1986 | Pfeifer | ............... | A47F 5/0869 211/57.1 |
| 5,419,066 A * | 5/1995 | Harnois | ............... | G09F 3/204 40/649 |
| 5,794,795 A * | 8/1998 | Stemmons | ............... | H02B 1/01 211/191 |
| 6,119,990 A * | 9/2000 | Kump | ............... | A47F 5/0068 211/57.1 |
| 6,246,004 B1 * | 6/2001 | Faccin | ............... | H02B 1/202 174/135 |
| 6,935,062 B2 * | 8/2005 | Lowry | ............... | G09F 3/204 248/205.1 |
| 7,287,350 B2 * | 10/2007 | Fast | ............... | G09F 3/0295 211/183 |
| 7,367,149 B2 * | 5/2008 | Fast | ............... | G09F 3/16 40/649 |
| 2006/0240683 A1 * | 10/2006 | Bre' | ............... | H02B 1/052 439/16 |
| 2006/0240707 A1 * | 10/2006 | Bre' | ............... | H02B 1/052 439/532 |
| 2012/0224916 A1 * | 9/2012 | Lohman | ............... | F16B 7/187 403/353 |

FOREIGN PATENT DOCUMENTS

| | | |
|---|---|---|
| DE | 103 50 465 A1 | 2/2005 |
| DE | 20 2008 015 309 U1 | 8/2009 |
| DE | 20 2010 011 620 U1 | 10/2010 |
| JP | 59-78819 U | 5/1984 |

* cited by examiner

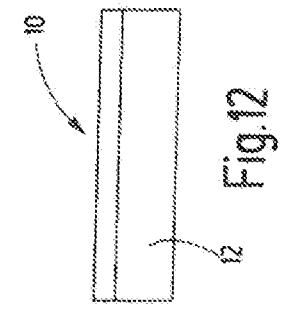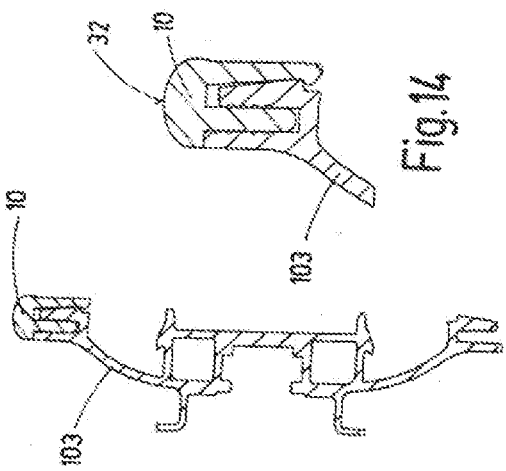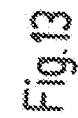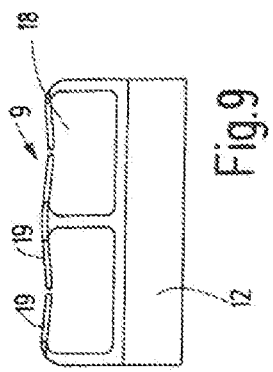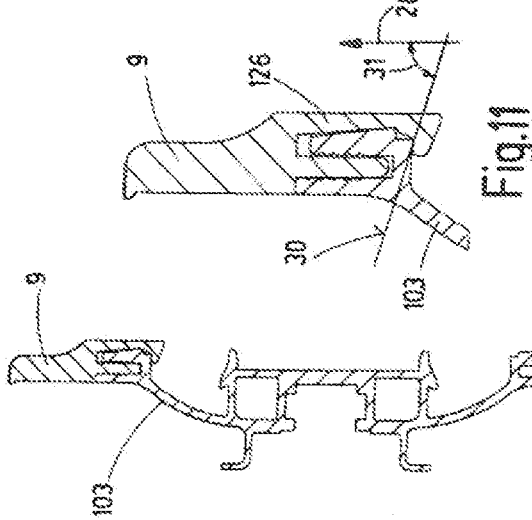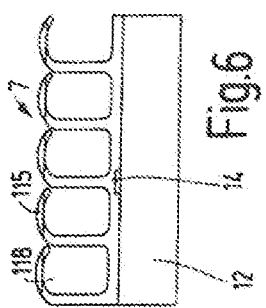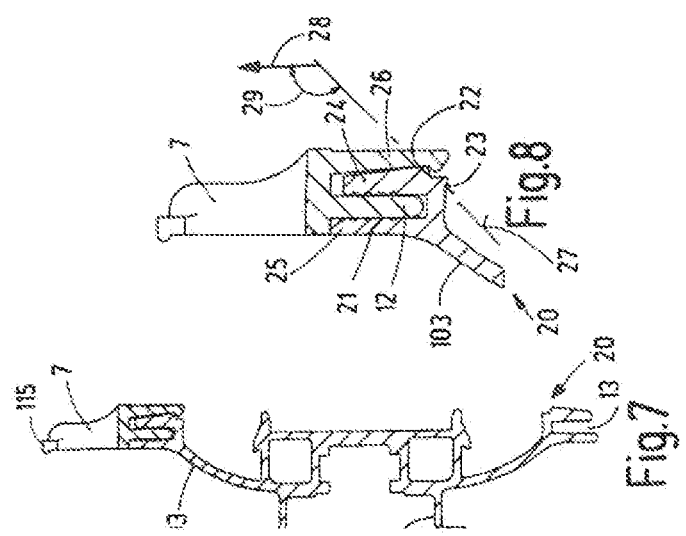

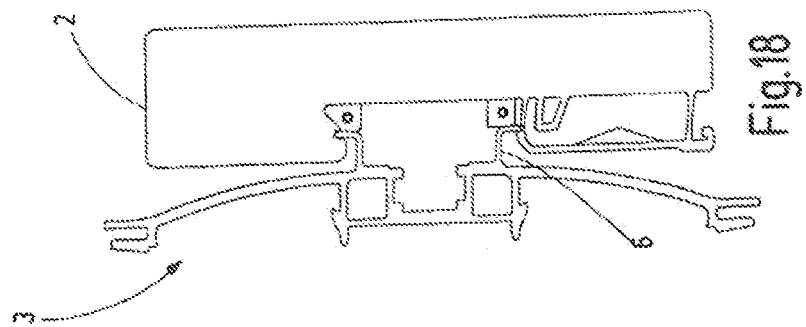
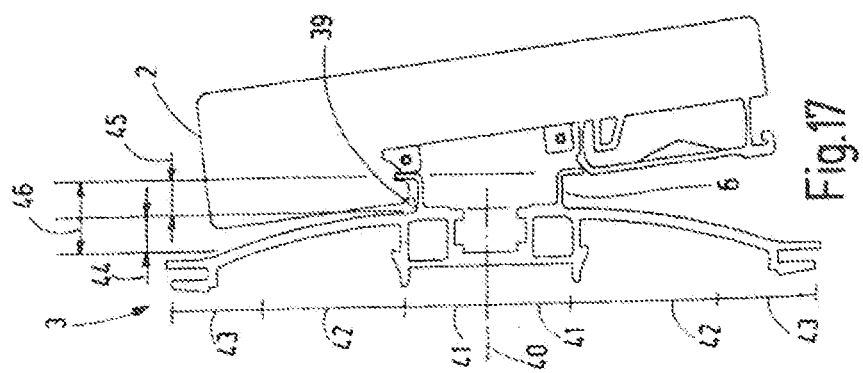
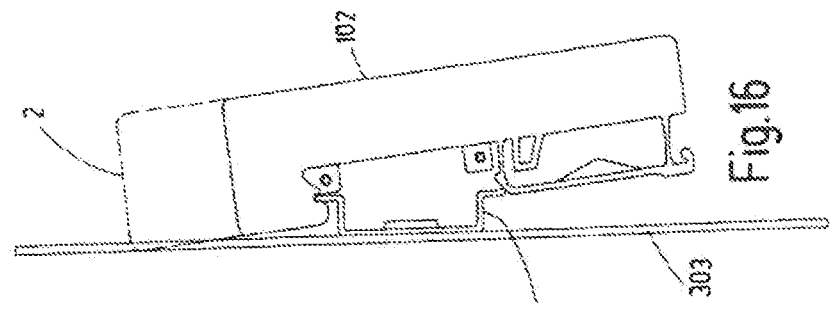
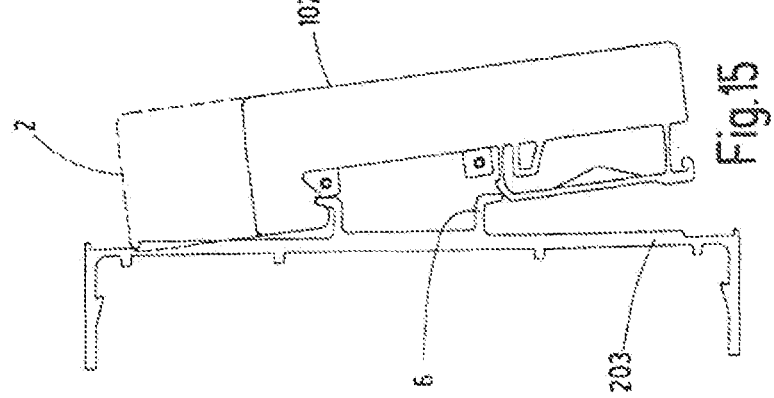

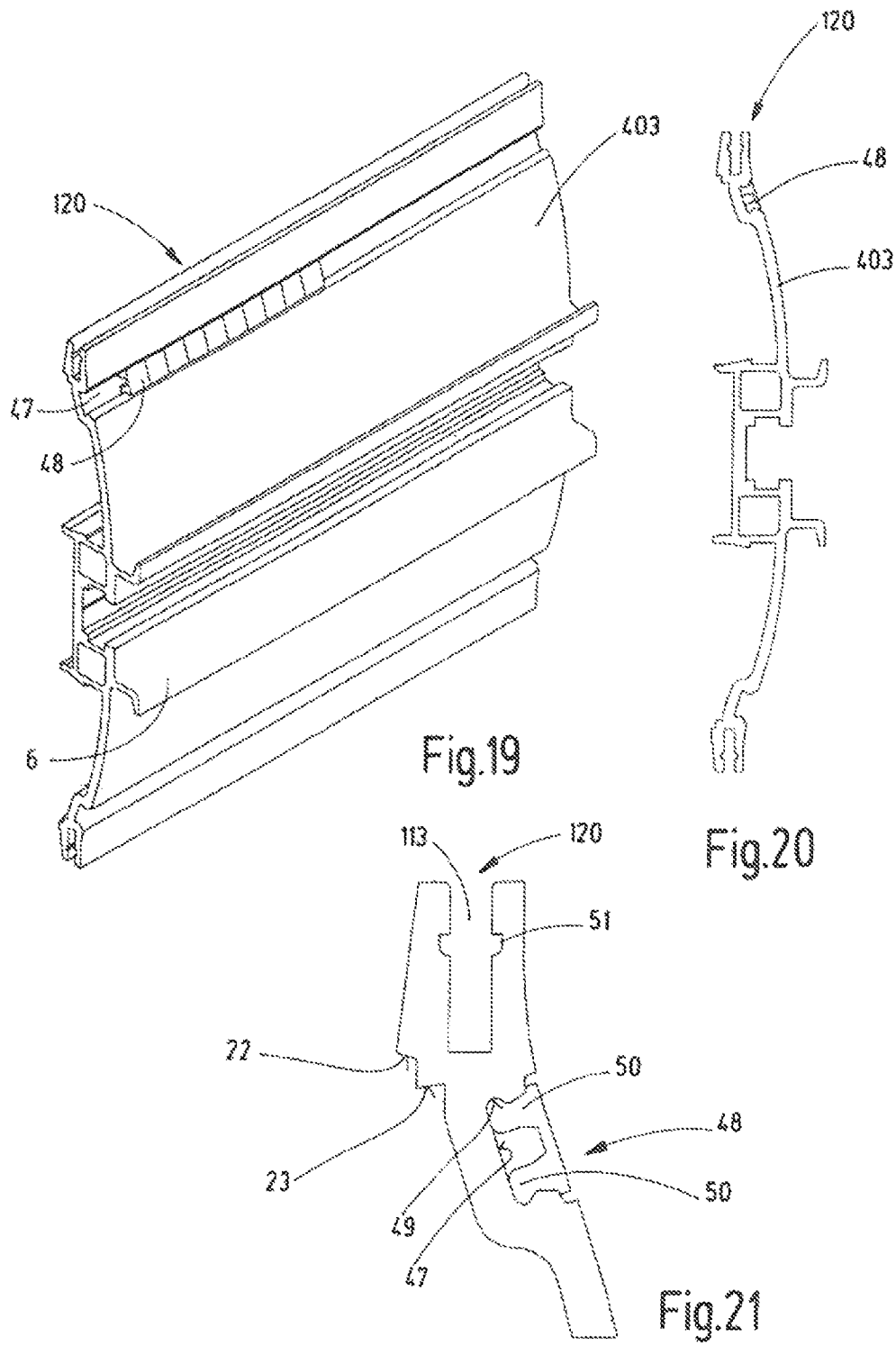

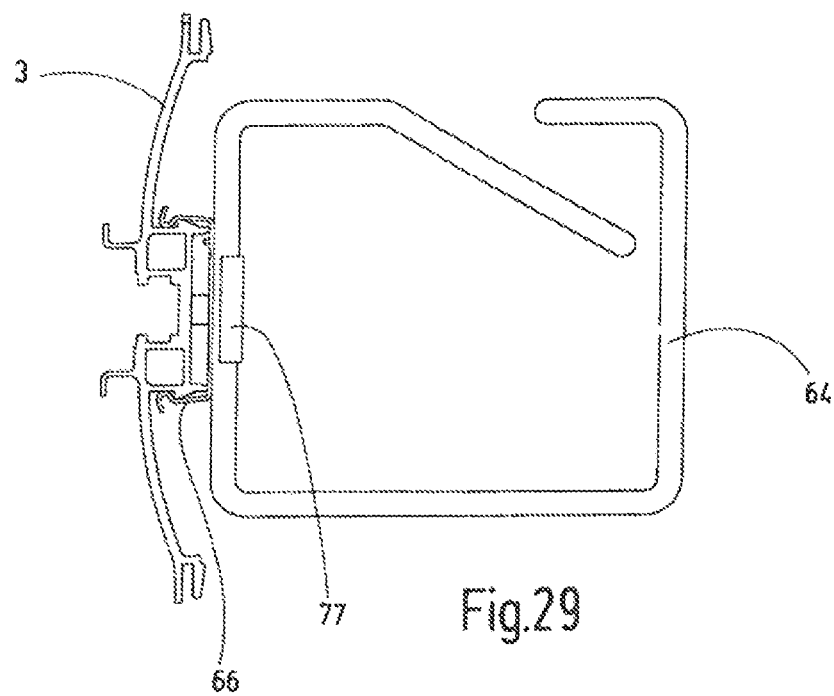
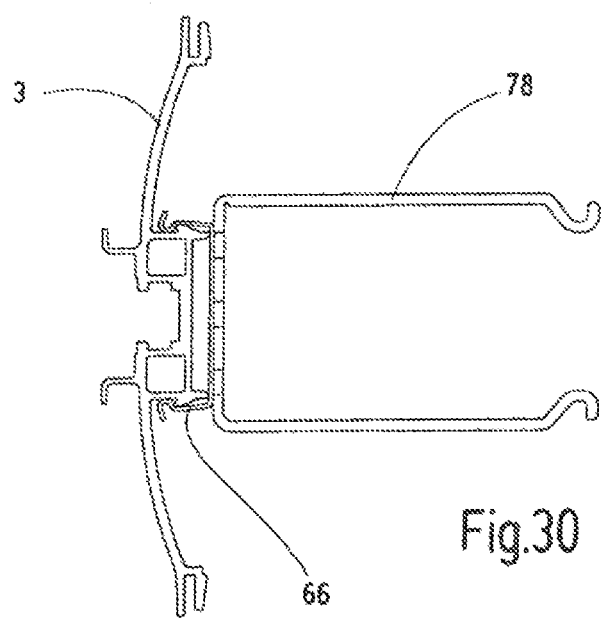

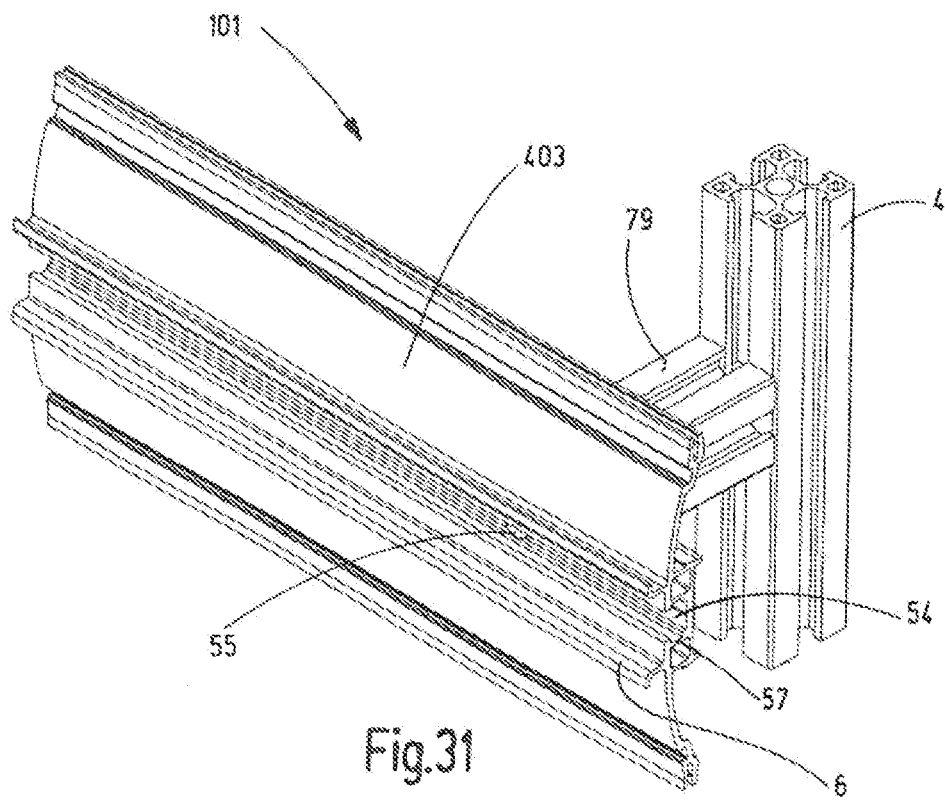
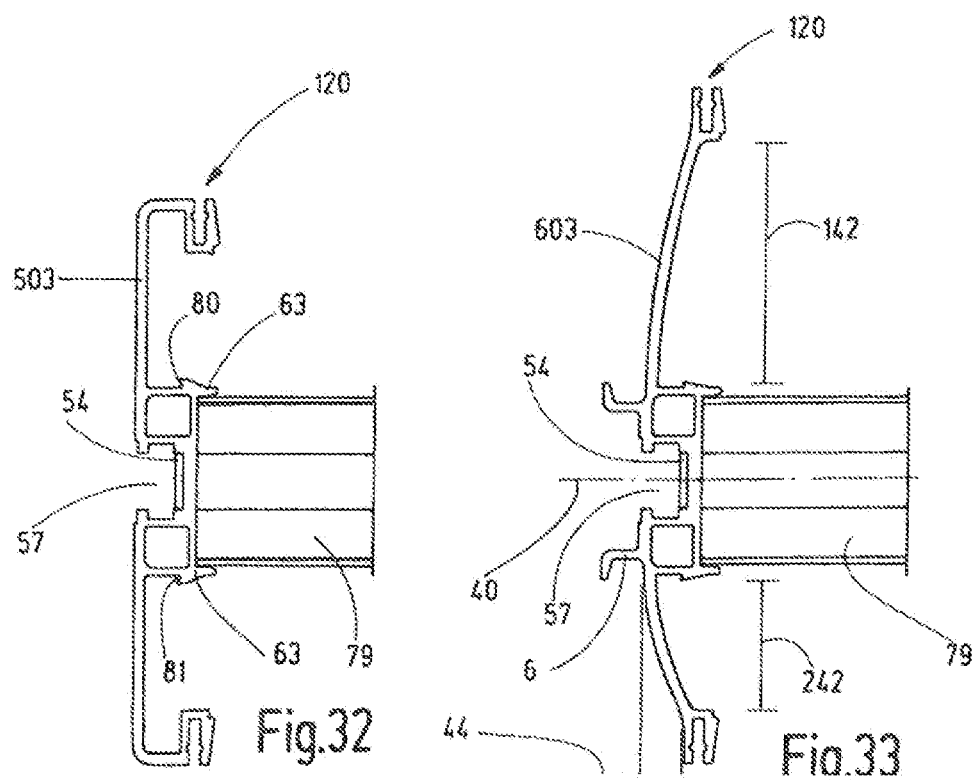

MOUNTING SYSTEM FOR ARRANGING ELECTRIC DEVICES IN SWITCHGEAR CABINETS

FIELD OF THE INVENTION

The invention relates to a mounting system for arranging electric devices, for example, in switch cabinets.

BACKGROUND OF THE INVENTION

In industrial control technology, electric devices are frequently arranged in switch cabinets or switch control boxes. The individual devices are mounted on support rails such as, for example, a top hat rail, and may be strung together. The devices are then wired, wherein a comb-like organizing means is attached to the mounting strip that includes the support rail, in order to situate the connecting lines of the devices in the proper order. An associated mounting system is offered by the applicant Friedrich Lütze in 71384 Weinstadt and is known, for example, from DE 297 16 229 U1, from DE '199 08 350 A1 or also from DE 20 2008 015 309 U1.

SUMMARY OF THE INVENTION

An object of the present invention is to provide a new mounting system having improved performance characteristics, in particular, being extremely versatile and being nevertheless easy to handle and to install. In one embodiment, the arranging of the devices on the support rail of the mounting strip is intended to be further simplified and to exhibit further increased flexibility. In addition, the heat management of the devices is intended to be improved.

The object is basically achieved by a mounting system including at least one mounting strip extending preferably horizontally, optionally also multiple parallel mounting strips, to which devices may be attached. The mounting strip includes a support rail on a first, preferably central, section, in cross section situated transversely to the longitudinal axis through the mounting strip. For example, a standardized top hat rail, or one corresponding substantially to a standard has the devices may be releasably fastened to it. The mounting strips may be fastened to a support device, for example, to profile rods extending at a right angle, and preferably vertically to the mounting strips. The mounting strips, together with the profile rods, may form a mounting frame, which may be pre-assembled and subsequently inserted, for example, in a switch cabinet.

In one embodiment, the mounting strip is shaped so that a third section of the mounting strip spaced apart from the support rail is at a greater vertical distance from the bottom point of the support rail than a second section disposed between the first and the third section at its end that is close to the support rail, in particular, the end adjacent to the support rail. The bottom point of the support rail may be designed as an integral part of the mounting strip and is formed, for example, by the transition of the support rail to the second area of the mounting strip adjoining the support rail.

The bottom point of the support rail forms a reference height, in relation to which the section of the support rail that interacts with the device when the device is fastened, differs, for example, by 7.5 or 15 mm. The third section of the mounting strip spaced apart from the support rail and, for example, situated at or near an end edge of the mounting strip, is located, in relation to the reference height, on the opposite side of the section of the support rail interacting with the device.

The vertical distance of the third section from the relative height in this case may be more than 50% and less than 200%, in particular, more than 80% and less than 125%, and preferably, approximately 100% of the vertical distance of the section of the support rail, which interacts with the device when the device is fastened. In one exemplary embodiment, the lateral distance of the third section from the support rail corresponds to approximately half the maximum allowable structural height of the device to be fastened to the support rail.

The vertical distance of the third section from the relative height may be formed by a single level or multi-level offset of the cross-sectional shape of the mounting strip. Alternatively, in an embodiment also achieving the underlying object, the mounting strip may have a convex curvature, at least in sections, so that, as a result, the first section of the mounting strip forming or supporting the support rail is curved outward. The mounting strip may exhibit the convex curvature, in particular, in the second section situated between the first and the third section.

The mounting strip may, for example, be formed from a profile rod and may be manufactured from aluminum or an aluminum-containing alloy. The profile of the mounting strip may be symmetrical relative to a center plane. Alternatively, or in addition, the mounting system may also include mounting strips asymmetrical relative to a center plane, in particular, those whose support rail and/or slide nut channel is symmetrical relative to a center plane, but the lateral extension of which originates from the center plane differs.

The convex curvature may extend at least on one side, preferably on both sides, over an angular range of more than 8° and less than 30°, in particular more than 10° and less than 25°, and preferably more than 12° and less than 20°. In one embodiment, the convex curvature extends on both sides over approximately 15°. In asymmetrical profiles of the mounting strip, the angle may be greater on one side, in particular, the curvature more extreme, than on the other side.

In one embodiment, the radius of the convex curvature is more than double, in particular more than triple, and preferably even more than four times the lateral extension of the curved second section.

Because of the profile of the mounting strip according to the invention, devices of large design can be fastened to the mounting strip, in spite of a relatively low height of the support rail of, for example, 7.5 mm, because the devices, when they are placed on the support rail, do not come into blocking contact with the mounting strip, in particular, not into blocking contact with the second section of the mounting strip. Particularly advantageously, devices of various sizes may be fastened to one and the same support rail. In particular for large devices, for example, providing a support rail having a greater support rail height is not necessary. This arrangement eliminates the necessity of holding in reserve and, if needed, inserting, mounting strips having support rails of different heights, or even of adapting a previously assembled mounting system through replacement of a mounting strip. Moreover, because of the profile of the mounting strip according to the invention, the distance of the device relative to the mounting strip is increased. As a result of the increased distance the cooling of the device is improved, and therefore, the heat management of the mounting system.

In one embodiment, the mounting strip includes a groove along its longitudinal extension for detachable locking insertion of identification plates. Thus, a reliable identification of the fastened devices and/or their connecting lines is simplified. The identification plates may be slid along the groove and positioned at the desired location.

In one embodiment, the groove includes an undercut, in which the identification plates insertable in the groove engage in a locking manner with the aid of resiliently deflectable arms. This arrangement further simplifies the mounting of the identification plates, in particular, the identification plates may be released and attached either without the use of tools or using simple tools and minimal force.

In one embodiment, the groove is situated in the area of the third section of the mounting strip or in the end of the second section distant from the first section. This ensures that the identification plate is always readable, even when the device is fastened. In addition, the identification plate may be attached or detached even when the device is fastened.

In one embodiment, the mounting strip includes, on at least one free end distant from the support rail, a receiving device for an organizing assembly, which may be fastened to the mounting strip for organizing the connecting lines of the devices attached to the mounting strip.

The devices may, for example, be electric devices, for example, power supplies, fuses, controls, input/output modules, interface units, temperature converters, analog/digital converters or the like. Alternatively or in addition, the device may also include non-electrical components, for example, optical components or pneumatic components.

Further advantages, features and details of the multiple exemplary embodiments described in detail with reference to the drawings may be essential to the invention, alone or in any combination thereof.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings that form a part of this disclosure:

FIG. 6 is a front view of an additional ordering segment;

FIG. 7 is a side view in section through a mounting strip having the ordering segment from FIG. 6 fastened thereon;

FIG. 8 is an enlarged partial side view in section of a portion of the mounting strip and ordering section of FIG. 7;

FIG. 9 is a side view of another ordering segment;

FIG. 10 is a side view in section through a mounting strip having the ordering segment of FIG. 9 fastened thereon;

FIG. 11 is an enlarged, partial side view in section of a portion of the mounting strip and ordering section of FIG. 10;

FIG. 12 is a front view of an additional component for the mounting system;

FIG. 13 is a side view in section through a mounting strip having the additional component of FIG. 12 fastened thereon;

FIG. 14 is an enlarged, partial side view in section of a portion of the mounting strip and additional component of FIG. 13;

FIG. 15 is a side view of a mounting strip according to the prior art;

FIG. 16 is a side view of a switchboard according to the prior art;

FIG. 17 is a side view of a mounting strip according to an exemplary embodiment of the invention during the attachment of a device;

FIG. 18 is a side view of a mounting strip according to an exemplary embodiment of the invention having a device secured thereto;

FIG. 19 is a perspective view of a mounting strip according to another exemplary embodiment of the invention;

FIG. 20 is a side view of the mounting strip of FIG. 19;

FIG. 21 is an enlarged, partial side view of a portion of the mounting strip of FIG. 20;

FIG. 29 is a side view of a second additional component of the mounting system according to an exemplary embodiment of the invention;

FIG. 30 is a side view of the mounting strip having a cable duct fastened on the back side by adapter elements according to an exemplary embodiment of the invention;

FIG. 31 is a perspective view of a mounting system according to a further exemplary embodiment of the invention;

FIG. 32 is a side view of a mounting strip according to another exemplary embodiment of the invention without a support rail; and FIG. 33 is a side view of an asymmetrical mounting strip according to yet another exemplary embodiment of the invention.

DETAILED DESCRIPTION OF THE INVENTION

Figure 1:
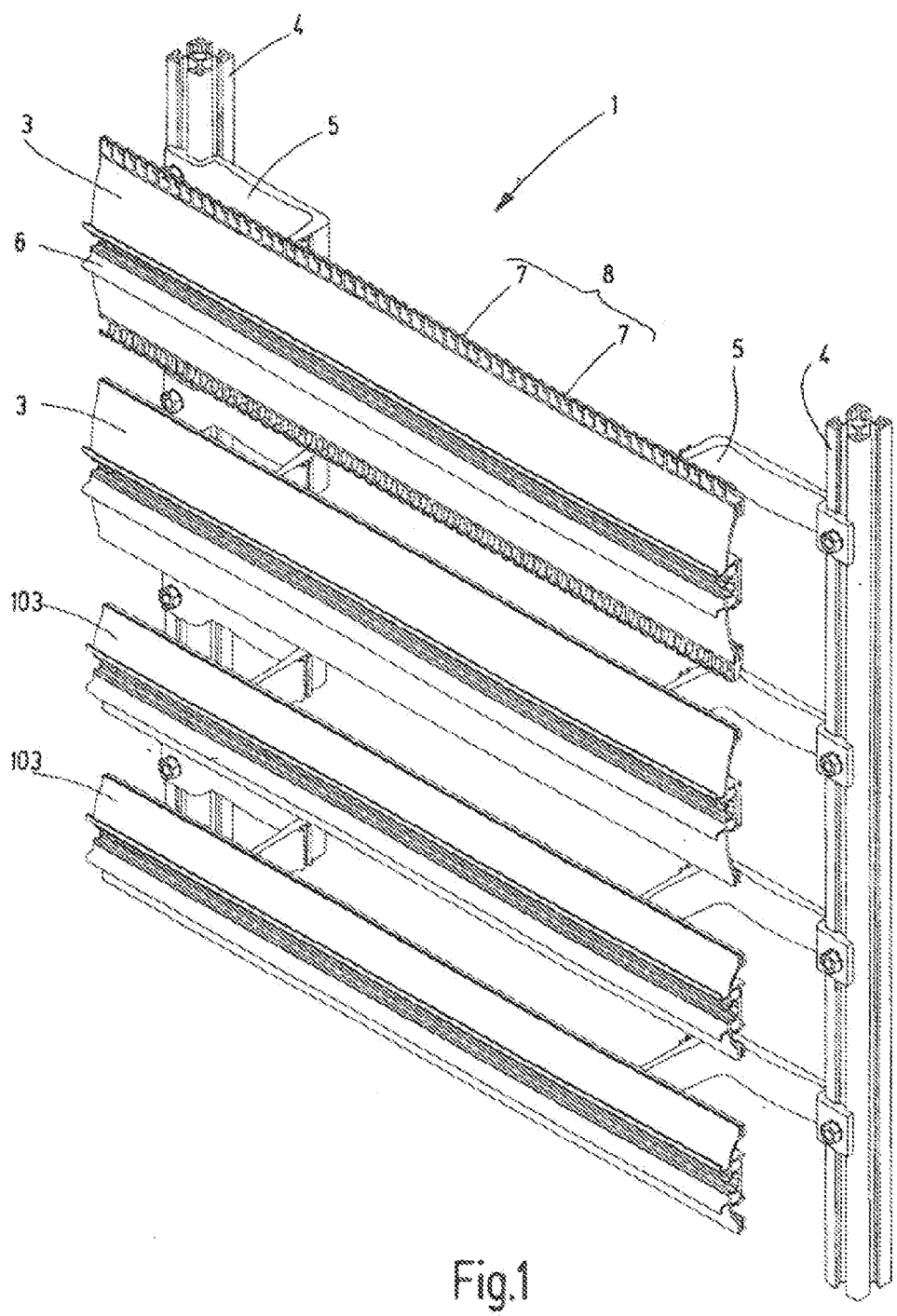
FIG. 1 is a perspective view of a mounting system according to an exemplary embodiment of the invention.

FIG. 1 shows a perspective view of an exemplary embodiment of a mounting system 1 comprising a total of four horizontal mounting strips 3, 103, to each of which at least one device 2 (FIG. 17) can be secured. The two lower mounting strips 103 have a lesser lateral extension compared to the two upper mounting strips 3. The mounting strips 3, 103 are each connected to a vertical profiled rod 4 at or close to the two ends of the mounting strips, for example up to 200 mm and, in particular, up to 125 mm from the two ends of the mounting strips. A mounting bracket 5 or any other type of connecting element 79 (FIG. 31) connects the mounting strip ends, in each case, to a vertical profiled rod 4. The mounting strips, together with the profiled rods 4, form a mounting frame, which mounting frame can be pre-assembled and subsequently inserted into an electrical enclosure in the state illustrated in FIG. 1, or with devices 2 and the connecting wires 34, 35 (FIG. 5) thereof already secured thereto. The mounting strips 3, 103 each comprise a support rail 6, to which the devices 2 are to be secured. In the exemplary embodiment, the support rail is a top-hat rail that is standardized or substantially corresponds to a standard and has a height of 7.5 mm.

An ordering assembly 8 is secured to each of the longitudinal edges of the upper mounting strip 3 in FIG. 1. The ordering assembly is composed of a plurality of identically designed ordering segments 7. One or more ordering segments 7 can be selectively detached from the ordering assembly 8 and be removed from the ordering assembly 8 or the mounting strip 3 to leave a gap therein, or be replaced by another ordering segment 9 (FIG. 2), 11, (FIG. 3), or a group of other ordering segments 9, 11.

Figure 2:
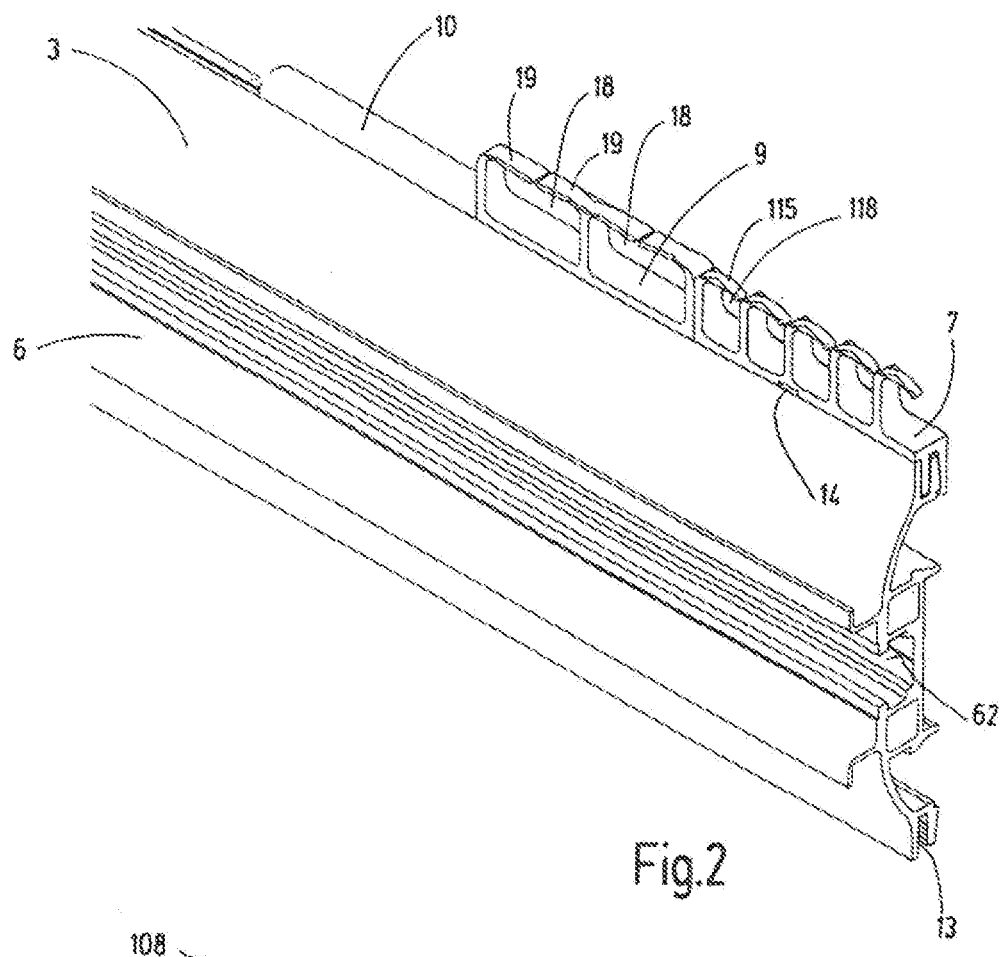
FIG. 2 is an enlarged, partial perspective view of the mounting strip of FIG. 1.
Figure 3:
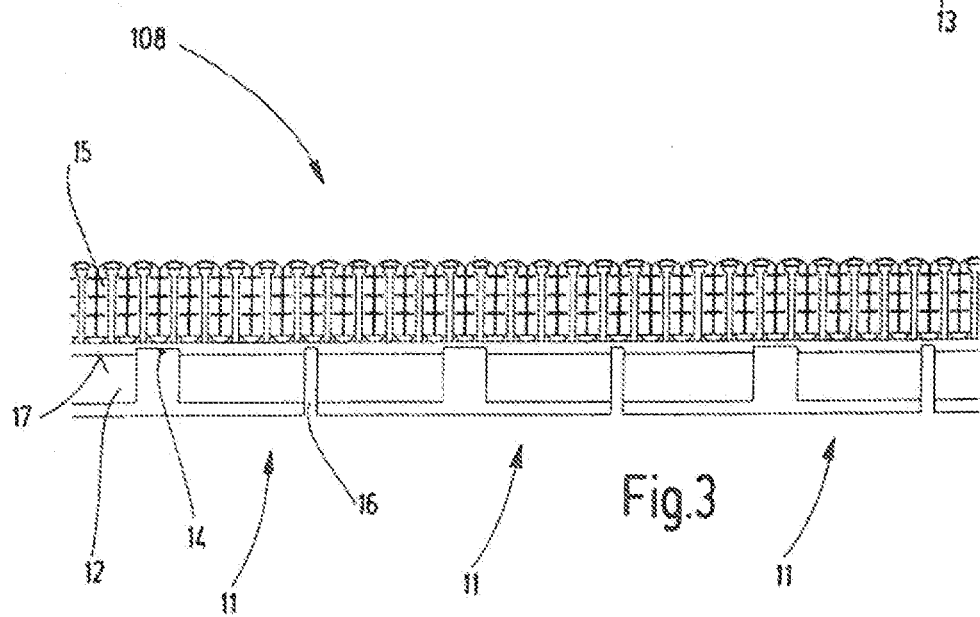
FIG. 3 is a front view of an ordering assembly according to an exemplary embodiment of the invention.

FIG. 2 shows an enlarged representation of a mounting strip 3. FIG. 3 shows an ordering assembly 108 composed of a plurality of ordering segments 11. Each ordering segment is formed as one piece. The ordering segments are disposed one behind the other. Instead of the one-piece design, the ordering segments 11 can also include interlinking parts 7a, 7b (FIG. 6) at the ends thereof, by which the ordering segments 11 can be detachably interlinked. The ordering assembly 108 can be produced in specifiable lengths of approximately 1 m or 2 m, for example, or in a continuous form.

Each ordering segment 11 comprises a peg-shaped fastening section 12 that can be inserted into a receiving device 20 disposed on the longitudinal edges of the mounting strip 3, and comprises a groove 13 (FIG. 7). A groove 14 extending in the insertion direction is formed in the fastening section 12 in the center relative to the longitudinal extension. One end that groove 14 forms a tool engagement surface and remains accessible in the inserted state and into which a tool 33 (FIG. 4) can be inserted for detaching the ordering segment 11.

The ordering segment 11, designed as one piece with the fastening section 12, preferably comprises elastically deflectable ordering elements 15. Between the ordering elements connecting wires 34, 35 of the device 2 can be inserted and thereby fixed in an ordered manner. Predetermined separation points 16, at which the ordering segments 11 can be separated, are formed by indentations in the fastening section 12. The indentations extend past a stop edge 17 formed by the ordering segment 11. Up to the stop edge, the ordering segment 11 can be inserted into the groove 13. As a result, the position of the predetermined separation point 16 is also visible in the inserted state. A separating cut can take place from the direction of the ordering elements 15.

The ordering segment 9 comprises two receiving channels 18, each of which extends across half the length of the ordering segment 9, for the connecting wires 34, 35 to be ordered. Two legs 19 of the ordering segment 9, which legs are disposed opposite the mounting strip 3 or the fastening section 12, can be elastically deflected so that the connecting wires 34, 35 to be ordered can be inserted into the receiving channel 18. In contrast, the ordering segment 7 comprises a plurality of ordering elements 115, specifically five thereof in the exemplary embodiment, each of which has an elastically deformable hook section for closing the receiving channel 118. Additional ordering segments can also include differently designed receiving channels 18, 118, in particular differently sized receiving channels 18, 118, for example one or more larger receiving channels 18 in a manner identical or similar to the ordering segment 9, and one or more smaller receiving channels 118 in a manner identical or similar to the ordering segment 7. In one embodiment, the longitudinal extension of the individual receiving channels 18, 118 is at least 5%, in particular at least 8%, and preferably at least 10% of the entire longitudinal extension of the ordering segment 7, 9. The additional component 10 of the mounting system 1 is an edge protection element. The ordering segments 7, 9, as well as the additional component 10, have an equal length of 50 mm in the exemplary embodiment.

Figure 4:
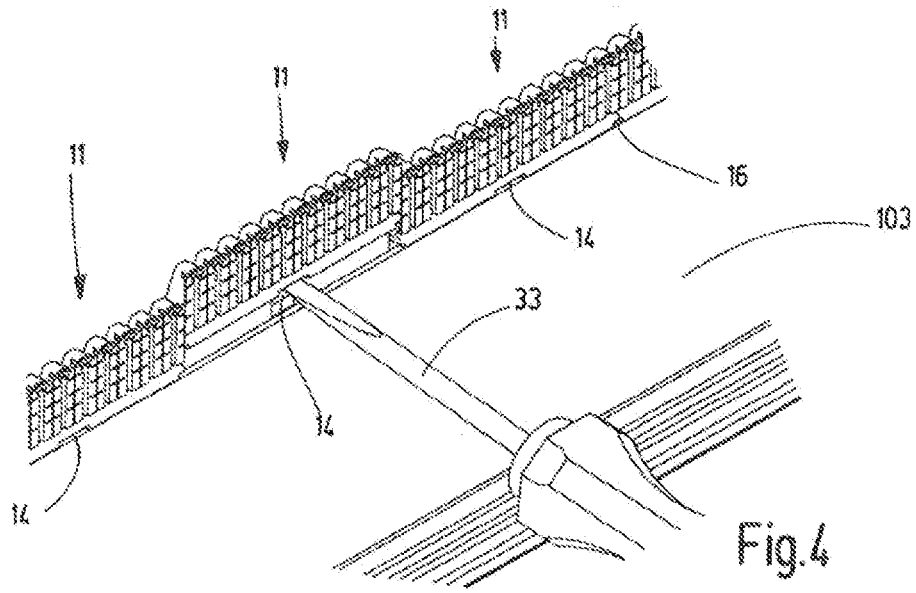
FIG. 4 is a perspective view of a mounting strip having an inserted ordering assembly.

FIG. 4 shows a perspective view of a mounting strip 103 having an ordering assembly 108, which is formed by a succession of ordering segments 11 and which is inserted into the groove 13. One ordering segment 11 was separated by two incisions at the predetermined separation points 16. By inserting a tool 33, for example the blade of a flat-blade screwdriver, the separated ordering segment 11 can be detached and removed from the mounting strip 103.

Figure 5:
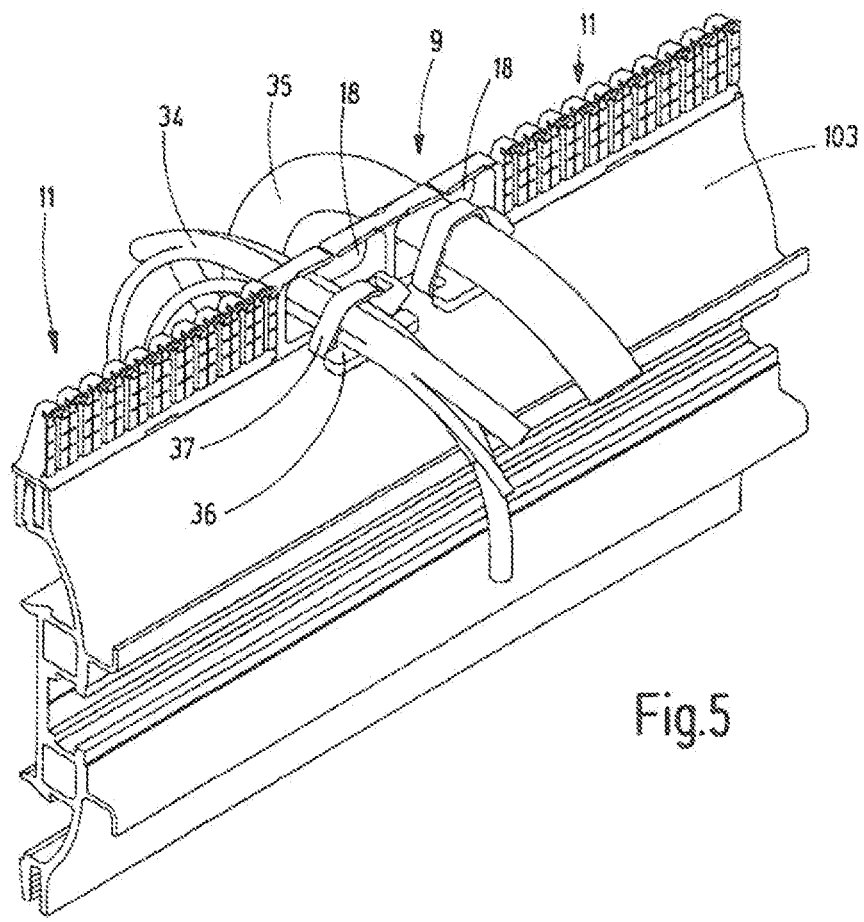
FIG. 5 is a perspective view of the mounting strip from FIG. 4 having a replaced ordering segment.

FIG. 5 shows a perspective view of the mounting strip 103 from FIG. 4, wherein, instead of the ordering segment 11 that was detached in FIG. 4, an ordering segment 9 having two large receiving channels 18 is inserted. A bundle of connecting wires 34 or a connecting wire 35 having a large cross-section is inserted into the receiving channels.

In order to improve the fixation of the connecting wires 34, 35, the ordering segment 9 has a holding section 36, which protrudes transversely to the longitudinal direction, in particular, protruding on the front side of the mounting strip 103 with the support rail 6. The ordering segment 9 includes one holding section 36 for each receiving channel 18. The holding section 36 is T-shaped on the free end thereof for the improved fixation of a holder 37 that can be a cable tie.

FIGS. 6, 9, and 12 are depictions of the ordering segments 7, 9 and the additional component 10. The ordering segment 9 and the additional component 10 can be non-detachably fixed to the mounting strip 3, which is why these components 9, 10 do not have a tool engagement surface 14.

FIG. 7 shows a section through a mounting strip 103 having an ordering segment 7 secured thereto. FIG. 8 shows, in an enlarged view, a cutout of FIG. 7 in the region of the connection of the ordering segment 7 to the mounting strip 103. The receiving device 20 extends along the longitudinal axis of the mounting strip 103 and is integrally formed with the mounting strip 103. The ordering segment 7 can be inserted into the receiving device that comprises the groove 13. The side walls of groove 13 have a plurality of additional grooves 21 or flutings extending in the longitudinal direction of the mounting strip 103, as well as two latching flanks 22, 23 on the outer side of the receiving device 20. The latching flanks 22, 23 extend in the longitudinal direction of the mounting strip 103 and are integrally formed therewith. In particular, the latching flanks 22, 23 are formed on an outer side of a wall 24, which borders the groove 13. This wall is offset in the lateral direction relative to the opposing wall 25, which also borders the groove 13. The wall 24 has a surface on the outer side extending diagonally relative to the insertion direction of the ordering segment 7 and, in particular, diagonally relative to the groove 13. Due to the diagonal position, the latch 26 can deflect when the ordering segment 7 is inserted with a low insertion force.

The ordering segment 7, which is a component of the first type of the mounting system 1, comprises an associated latch 26 formed by a leg. In the non-deformed initial state, the leg extends virtually parallel to the fastening section 12, but can be elastically deflected relative thereto. A latching flank 27 of the first type is formed close to the free end of the leg. The latching flank, together with the direction 28 of the pulsing force, encloses an angle 29 of more than 90°. As a result, the interlocking can be released solely with pulling force. To simplify handling, the release force can be applied by a flat-head screwdriver 33, which can be inserted into the tool engagement surface 14.

FIG. 10 shows a section through a mounting strip 103 having an ordering segment 9 secured thereto. FIG. 11 shows and enlarged representation of a portion of FIG. 10 in the region of the connection of the ordering segment 9 to the mounting strip 103. The ordering element 9 is a component of the second type of the mounting system 1 having an associated latch 126 having a latching flank 30 of the second type. Latching flank 30, together with the direction 28 of the pulling force, encloses an angle of less than 90°. As a result, the interlocking cannot be released solely with pulling force, but rather is self-locking. The ordering element 9 is therefore very securely fastened on the mounting strip 3, as necessary for the large receiving channels 18 for accommodating large and heavy connecting wires 34, 35.

FIG. 13 shows a section through a mounting strip 103 having an additional component 10 secured thereto. FIG. 14 shows an enlarged view of a portion of FIG. 13, in the region of the connection of the additional component 10 to the mounting strip 103. The additional component 10 is an edge protection element having a convex, non-circular surface 32 extending across an angular range of 180° on the surface thereof facing away from the mounting strip 103. The additional component 10 can be produced, for example, as an extrusion part made of a plastic and can be trimmed individually to the desired length. The additional component 10 does not have a tool engagement surface 14. Although possible, in principle, to release the interlocking by a pulling force in the direction 28, this release cannot be carried out manually or requires a large force due to the material that is used and the structural design. This structure is intended to prevent the additional component 10 from being inadvertently detached from the mounting strip 103.

In one embodiment, for each ordering segment 7, 11 or component in which the tool engagement surface 14 is visible when the ordering segment or component is in the state of being secured to the mounting strip 3, 103, the interlocking is not self-locking. The segment or component rather can be released solely with pulling force. In particular, each ordering segment 7, 11 comprises a latching means 26 having a latching flank 27 of the first type, by which the interlocking can be released solely with pulling force.

FIGS. 15 and 16 respectively show a side view of a mounting strip 203 according to the prior art and a switchboard 303 according to the prior art, each of which has a support rail 6 having a height of, for example, 7.5 mm. Due to the relatively low height of the support rail 6, devices 2 having a relatively large installation height cannot be secured. At most devices 102 that have a reduced installation height on at least one side can be secured. To solve the problem of being able to secure large devices 2 also in the case of support rails 6 having a relatively low installation height, a mounting strip 3, which is preferably designed to be symmetrical with respect to a center plane 40, has a first preferably middle or center section 41. In middle section 41, the support rail 6 is also formed. A third or end section 43 is spaced apart from the support rail 6 and is at a greater lateral or transverse horizontal distance 44 from the bottom or attachment point 39 of the support rail 6 than a second or intermediate section 42. Second section 42 is disposed between the first section 41 and the third section 43, at the end of the middle section that is close to the support rail 6, in particular at the end thereof adjoining the support rail 6.

In the exemplary embodiment of FIGS. 17 and 18, this attachment of device 2 is achieved by a convex curvature of the mounting strip 3, in particular, in the second section 42 thereof. The convex curvature extends across an angular range of approximately 15°. The radius of the convex curvature is approximately four times the lateral extension of the curved second section 42. The distance 44 between an end of the second section 42 that faces the third section 43 and an end of the second section 42 that faces the first section 41 corresponds approximately to the width or lateral extension 45 of the support rail 6. The overall width or extension 46 for securing the device 2 to the support rail 6 is then approximately twice the width or lateral extension 45 of the support rail 6. As shown in FIGS. 17 and 18, devices 2 having a large design can be easily secured to the mounting strip 3 despite the relatively low height 45 of the support rail 6.

FIG. 19 shows a perspective view of a mounting strip 403. FIG. 20 shows a side view of the mounting strip 403 of FIG. 19. FIG. 21 shows an enlarged representation of a portion of FIG. 20 in the region of a groove 47, which is integrally formed with the mounting strip 403, for the releasably snap-in insertion of identification labels 48. The groove 47 has an undercut 49 on both sides, into each of which an elastically deflectable leg 50 of the identification label 48 engages in a latching manner. The groove 47 is disposed in the region of the third section 43 of the mounting strip 403 or in an end of the second section 42 of the mounting strip 403 that is remote from the first section 41. The identification label 48 can then be read even when a device 2 is secured to the mounting strip 403. The identification label 48 can identify, for example, a connecting wire 35, 36 that is routed adjacent to the identification label 48 from the back side to the front side of the mounting strip 403, or a device 2 that is disposed on the support rail in the region of the identification label 48.

Ordering assembly 8 or other components 10 of the mounting system 1 can be inserted into the receiving device 120. In particular, they can be inserted into the engagement groove 113. At least one of the walls that delimits the engagement groove 113 has one or more recesses 51 or flutings that preferably extend in the longitudinal direction of the engagement groove 113, for example for the non-detachable interlocking of a component of the mounting system 1 that can be inserted into the receiving device 120 or plugged into the engagement groove 113. On the outer side, the receiving device 120 also has a first latching flank 22 and a second latching flank 23. The first, non-locking latching flank 22 is situated at a shorter distance from the free end of the receiving device 120 than the locking, second latching flank 23.

Figure 22:
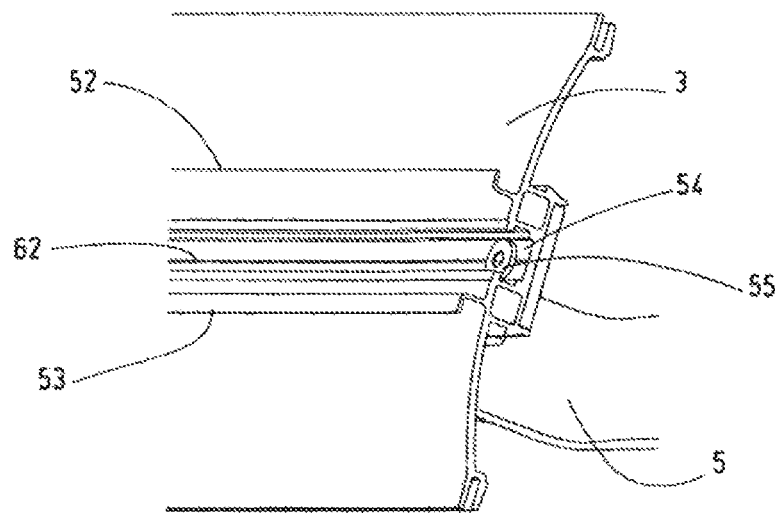
FIG. 22 is a perspective view of one end of the mounting strip of FIG. 1.
Figure 23:
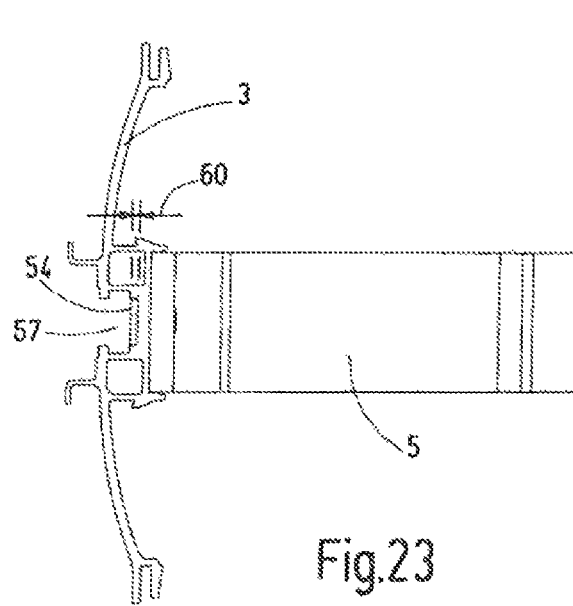
FIG. 23 is a side view of the mounting strip of FIG. 22.
Figure 24:
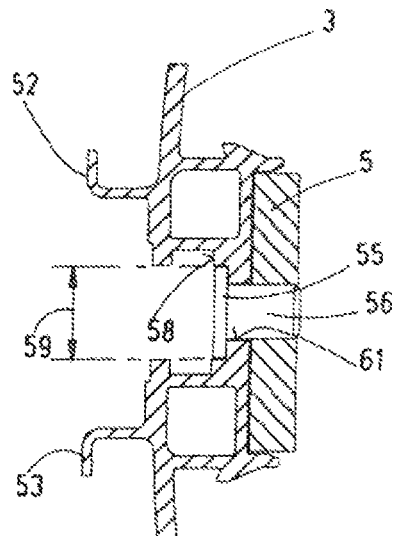
FIG. 24 is an enlarged, partial side view in section of a portion of the mounting strip of FIG. 23.

FIG. 22 shows a perspective view of one end of the mounting strip 3 with the connection to the mounting bracket 5. FIG. 23 shows a side view of the mounting strip 3 of FIG. 22. FIG. 24 shows an enlarged representation of a portion of FIG. 23 in the region of the connection between the mounting strip 3 and the mounting bracket 5. The mounting strip 3 has a groove 54 between the two support legs 52, 53 of the support rail 6. The groove extends in the longitudinal direction of the mounting strip 3 and preferably in the center, and accommodates the head of a flat-head screw, in particular. Thus, in a state in which the mounting strip 3 is connected to the mounting bracket 5, the head 55 does not protrude into the region between the two support legs 52, 53, and therefore, does not obstruct the securing of the device 2.

In the exemplary embodiment, the mounting strip 3 comprises a slide-nut channel 57 between the two support legs 52, 53. The slide-nut channel extends in the longitudinal direction of the mounting strip 3. The groove 54 is formed in the base 58 of the slide-nut channel 57. The head 55 of the connector 56, in the connected state, does not protrude past the base 58 of the slide-nut channel 57 or into the slide-nut channel 57. As a result, even when the connector 56 is installed, one or more slide nuts can be inserted into the slide-nut channel 57, in particular, also into a section of the slide-nut channel 57 that is delimited on both sides by connector 56.

The width 59 of the groove 54 is less than 50% greater than the width of the head 55 of the connector 56, in particular less than 25% and preferably less than 10%. The depth 60 of the groove 54 is less than 50% greater than the height of the head 55 of the connector 56, in particular less than 25%, and preferably less than 10%. The width 59 of the groove 54 is less than 90% of the width of the slide-nut channel 57, in particular less than 80% and, in the exemplary embodiment, is approximately 75%. The width 59 of the groove 54 corresponds approximately to the width of the opening of the slide-nut channel 57 that faces the support legs 52, 53. The depth 60 of the groove 54 is less than 150% of the depth of the slide-nut channel 57, in particular, less than 100% and, preferably, less than 50%.

In the exemplary embodiment, the connector 56 is a flat-head screw, which is inserted into a passage opening 61 in the mounting strip 3, and is screwed into a threaded bore of the mounting bracket 5. The passage opening 61 can be optionally formed at a point in the mounting strip 3 that is suitable for connecting the mounting strip 3 to the mounting bracket 5. To this end, the mounting strip 3 has a slot 62, which functions as a centering aid, is formed in the middle of the base of the groove 54, extends in the longitudinal direction of the mounting strip 3, and is preferably V-shaped.

Figure 25:
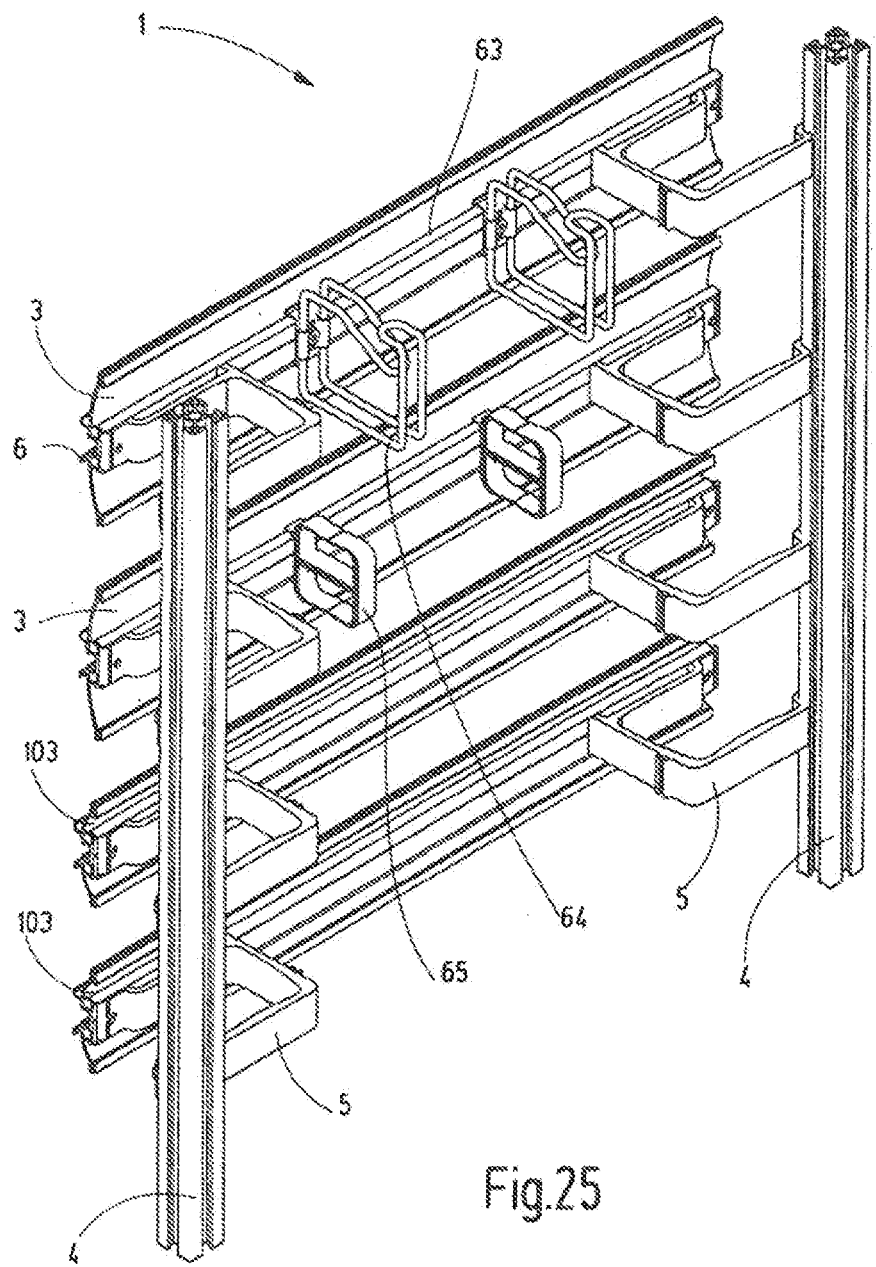
FIG. 25 is a perspective view of the back side of the mounting system of FIG. 1.

FIG. 25 shows a perspective view of the back side of the mounting system 1 from FIG. 1. The mounting strip 3 comprises, on the back side thereof disposed opposite the support rail 6, at least one latching strip 63 extending in the longitudinal direction of the mounting system 1. Additional components 64, 65 of the mounting system 1 can be latched onto the latching strip directly or be indirectly fastened thereon by an adapter element 66 that can be latched thereto (FIG. 27).

Figure 26:
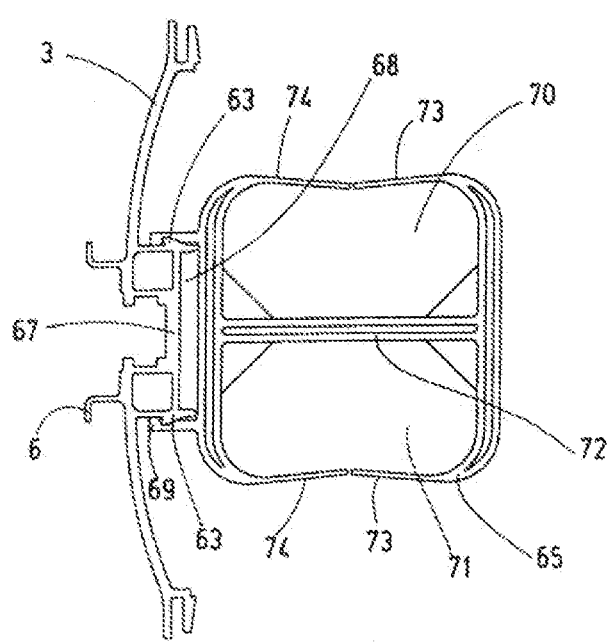
FIG. 26 is a side view of a mounting strip of FIG. 25.

FIG. 26 shows a side view of the mounting strip 3 of FIG. 25. The mounting strip 3 comprises, on the back side and in the middle region thereof, two latching strips 63 extending parallel to one another. The free ends of latching strips 63 overhang relative to a connecting strip 67 and thereby delimit a groove 68 or a receiving channel, into which, for example, either the mounting bracket 5 can be inserted or a connecting element can engage, for example, a connecting element for connecting an additional component 64 to the adapter element 66. The latching strips 63 are integrally formed with the mounting strip 3.

The latching strips 63 comprise a self-locking latching edge 80 (FIG. 32), in particular a latching edge 80 having an undercut 81. The two latching strips 63 extend so as to be spaced apart from one another, but parallel to one another in the region of the support rails 6, which rails are disposed on the front side. A first additional component 65 is snapped onto the latching strips 63 for bundling connecting wires 34, 35 of the device 2 disposed on the front side. The connecting wires extend on the back side of the mounting strip 3. The device 2 has a connection section 69, which can be snapped onto the latching strips 3, as well as two cable guides 70, 71 for accommodating connecting lines 34, 35. The cable guides 70, 71 are symmetrical with respect to a center plane, as is the double-walled partition 72. The two cable guides 70, 71 are each accessible from the outside via two elastically deflectable legs 73, 74. The legs 73, 74 are disposed on opposing sides that adjoin the connecting section 69.

Figure 27:
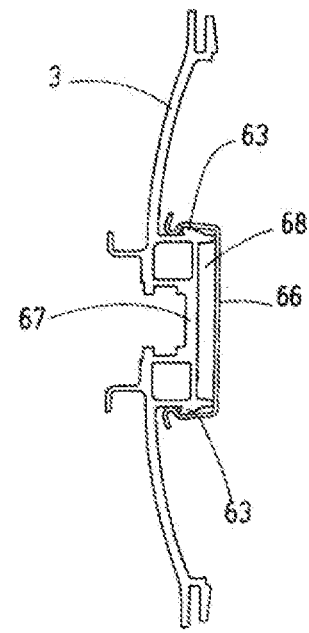
FIG. 27 is a side view of a mounting strip of FIG. 1 having an adapter element that has been snapped onto the latching strips.
Figure 28:
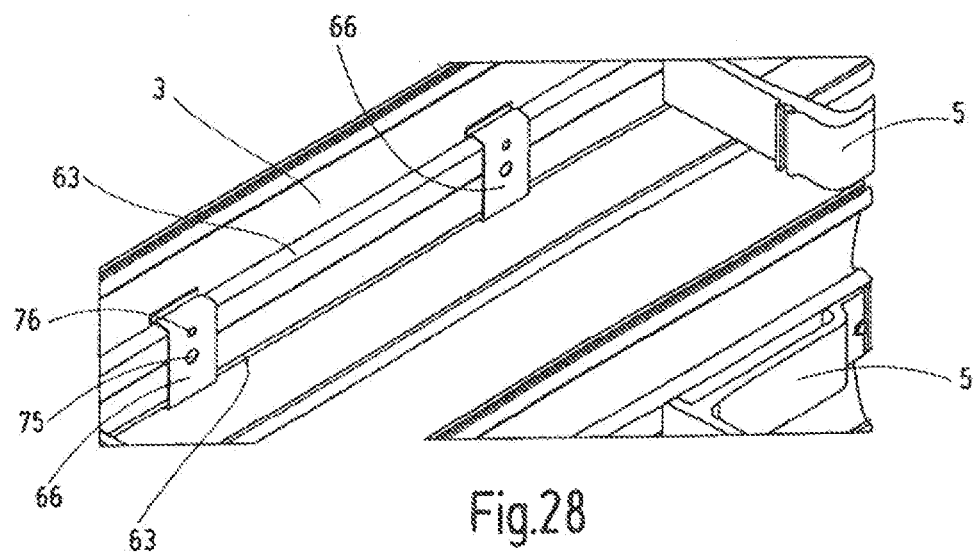
FIG. 28 is a perspective view of the back side of the mounting strip of FIG. 1 having two snapped-on adapter elements.

FIG. 27 shows a side view of a mounting strip 3 comprising an adapter element 66 snapped onto the latching strips 63. FIG. 28 shows a perspective view of the back side of the mounting strip 3 comprising two snapped-on adapter elements 66. The adapter element 66 has a preferably centrally disposed bore 75, which can be designed as a threaded bore or can have a roller-formed thread, an extruded hole, an insert nut, or the like, and one or more preferably eccentrically disposed, additional bores 76, which can form a mechanical interface for securing additional components of the mounting system 1 onto the back side of the mounting strip 3. The additional bore 76 can form, for example, a positioning part for securing additional components, for example, for inserting an associated positioning part of the additional components. The bores 75, 76 correspond to the receiving channel 68, which is limited by the adapter element 66, the two latching strips 63 and the connecting strip 67.

FIG. 29 shows a second additional component 64 of the mounting system 1, which second additional component is an additional bundling element for bundling supply lines 34, 35. The second additional component 64 is a double-tracked bent wire element secured to the adapter element 66 in a clamped manner by a fastening element 77 screwed together with the adapter element 66. When the fastening element 77 is partially loosened, the second additional component 64 is still held, but can be moved relative to the adapter element 66 along the two wire tracks extending parallel to one another and can be subsequently clamped again such that the desired position of the two additional components 64 can be adjusted relative to the adapter element 66 or the mounting strip 3 fixed on the latching strips 63.

FIG. 30 shows a side view of the mounting strip 3 having a cable duct 78 snapped onto the back side of the mounting strip 3 by the adapter element 66.

FIG. 31 shows a perspective view of an additional exemplary embodiment of a mounting system 101, in which at least one mounting strip 403 is connected, at or close to the two ends thereof, to a vertical profiled rod 4 by a connecting element 79 in each case. The connecting element 79 is formed from a section of a profile from which the profiled rod 4 is also produced. As an alternative, any other type of spacer can be used, for example, a profiled piece having smaller cross-sectional dimensions or a rod that has been trimmed to the desired separation of the mounting strip 403 from the profiled rod 4. The head 55 of the screw, connecting the mounting strip 403 connected to the connecting element 79, is disposed so as to be sunken in the groove 54 in the slide-nut channel 57.

FIG. 32 shows a side view of a further exemplary embodiment of a mounting strip 503, which can be fastened to a profiled rod 4 by a connecting element 79. The connecting element 79 preferably has a square cross-section and has an edge length that corresponds to or is slightly shorter than the separation between the two latching strips 63. The latching strips 63 then form a guide, by a form closure, when the connecting element 79 is inserted into the receiving channel 68 delimited by the latching strips 63 (FIG. 27). In addition, when any type of spacer other than the connecting element 79 is used, advantageously this spacer also has a form closure with the latching strips 63, for example in the case of a spacer rod having a round cross-section or rounded corners. When this spacer rod has two mutually opposing, flattened sides on the end section thereof facing the mounting strip 503, the separation of which corresponds to the separation of the latching strips 63.

In a manner similar to the above-described exemplary embodiments, the mounting strip 503 comprises a receiving device 120 for ordering assembly 8 or additional components 10 as well as a slide-nut channel 57 having a groove 54. However, the mounting strip 503 does not have a support rail 6. Instead, the devices 2 are secured to the mounting strip 503 by screws, which can be screwed together with nuts that are disposed in the slide-nut channel 57 and can be displaced therein. The sections of the mounting strip 503 adjoining the two sides of the slide-nut channel 57 are planar, for example for placement thereon, over a large area, of the device 2 to be secured. The ends of the planar sections facing away from the slide-nut channel 57 are bent at right angles. Each channel 57 ultimately forms a receiving device 120 offset relative to the plane defined by the planar sections.

FIG. 33 shows a side view of a further exemplary embodiment of a mounting strip 603, which can be fastened to a profiled rod 4 by a connecting element 79. The mounting strip 603 has a convex curvature on the front side thereof, wherein a support rail 6 is disposed at the position of the greatest protrusion of said curvature. Whereas the support rail 6 and the slide-nut channel 57 having the groove 54 are symmetrical relative to the center plane 40, the profile of the mounting strip 603 is asymmetrical relative to this center plane 40. The second section 142, which adjoins the support rail 6 on one side and terminates at the receiving device 120, has a greater extension in the lateral direction than the second section 242 adjoining the support rail 6 on the other side. In contrast thereto, the vertical distance 44 between the two sections 142, 242 is the same.

While various embodiments have been chosen to illustrate the invention, it will be understood by those skilled in the art that various changes and modifications can be made therein without departing from the scope of the invention as defined in the claims.

The invention claimed is:

1. A mounting system for arranging electrical devices, comprising:
    a horizontal mounting strip including a central section, an intermediate section and an end section in a transverse cross section to a longitudinal axis through said mounting strip, said intermediate section being between said central and end sections, said mounting strip having a convex curvature at least in one of said sections thereof;
    an electrical device having first and second device latch members extending on a back surface thereof; and
    a support rail coupled to and extending from said central section of said mounting strip and attached to said electrical device, said end section being spaced apart from said support rail at a greater transverse horizontal first distance from an attachment of said support rail to said intermediate section than an end of said intermediate section close to said support rail, said convex curvature extending on at least one of two sides of said mounting strip over an angular range of more than 8 degrees and less than 30 degrees, said support rail having first and second rail latch members, said first and second device latch members engaging said first and second rail latch members, respectively, said first device latch member being pivotable on said first rail latch member prior to pivotal engagement of said second device latch member with said second rail latch member.

2. A mounting system according to claim 1 wherein said convex curvature extends on both of said sides.

3. A mounting system according to claim 1 wherein the angular range is more than 10 degrees and less than 25 degrees.

4. A mounting system according to claim 3 wherein the angular range is more than 12 degrees and less than 20 degrees.

5. A mounting system according to claim 1 wherein said first and second rail latch members extend in opposite vertical directions from free ends of a U-shaped base of said support rail; and
    said first and second device latch members comprise recesses receiving free ends of said first and second latch members, respectively.

6. A mounting system for arranging electrical devices, comprising:
    a horizontal mounting strip including a central section, an intermediate section and an end section in a transverse cross section to a longitudinal axis through said mounting strip, said intermediate section being between said central and end sections, said mounting strip having a convex curvature at least in one of said sections thereof;
    an electrical device having first and second device latch members extending on a back surface thereof; and
    a support rail coupled to and extending from said central section of said mounting strip and attached to said electrical device, said end section being spaced apart from said support rail at a greater transverse horizontal first distance from an attachment of said support rail to said intermediate section than an end of said intermediate section close to said support rail, said intermediate section being curved outwardly, said support rail having first and second rail latch members, said first and second device latch members engaging said first and second rail latch members, respectively, said first device latch member being pivotable on said first rail latch member prior to pivotal engagement of said second device latch member with said second rail latch member.

7. A mounting system according to claim 6 wherein a radius of said convex curvature is more than double a lateral extension of a curvature of said intermediate section.

8. A mounting system according to claim 7 wherein the radius is more than triple the lateral extension.

9. A mounting system according to claim 8 wherein the radius is more than four times the lateral extension.

10. A mounting system according to claim 6 wherein said first and second rail latch members extend in opposite vertical directions from free ends of a U-shaped base of said support rail; and
    said first and second device latch members comprise recesses receiving free ends of said first and second latch members, respectively.

11. A mounting system for arranging electrical devices, comprising:
    a horizontal mounting strip including a central section, an intermediate section and an end section in a transverse cross section to a longitudinal axis through said mounting strip, said intermediate section being between said central and end sections, said mounting strip having a convex curvature at least in one of said sections thereof;

an electrical device having first and second device latch members extending on a back surface thereof; and a support rail coupled to and extending from said central section of said mounting strip and attached to said electrical device, said end section being spaced apart from said support rail at a greater transverse horizontal first distance from an attachment of said support rail to said intermediate section than an end of said intermediate section close to said support rail, said central section with said support rail being curved outwardly, said support rail having first and second rail latch members, said first and second device latch members engaging said first and second rail latch members, respectively, said first device latch member being pivotable on said first rail latch member prior to pivotal engagement of said second device latch member with said second rail latch member.

12. A mounting system according to claim 11 wherein the first distance is more than 50 percent and less than 200 percent of a horizontal transverse second distance from said attachment of said support rail to an end section of said support rail being distant from said mounting strip and interacting with said electrical device.

13. A mounting system according to claim 12 wherein the first distance is more than 80 percent and less than 120 percent of the second distance.

14. A mounting system according to claim 13 wherein the first distance is approximately 100 percent of the second distance.

15. A mounting system according to claim 11 wherein said intermediate section has a convex curvature.

16. A mounting system according to claim 11 wherein said convex curvature extends on two sides of said mounting strip over angular range of more than 8 degrees and less than 30 degrees.

17. A mounting system according to claim 16 wherein the angular range is more than 10 degrees and less than 25 degrees.

18. A mounting system according to claim 17 wherein the angular range is more than 12 degrees and less than 20 degrees.

19. A mounting system according to claim 11 wherein a radius of said convex curvature is more than double a lateral extension of a curvature of said intermediate section.

20. A mounting system according to claim 19 wherein the radius is more than triple the lateral extension.

21. A mounting system according to claim 20 wherein the radius is more than four times the lateral extension.

22. A mounting system according to claim 11 wherein said mounting strip includes a groove along a longitudinal extension thereof in which identification plates are detachably locked.

23. A mounting system according to claim 22 wherein said groove comprises an undercut engaging resiliently deflectable arm on said identification plates.

24. A mounting system according to claim 22 wherein said groove is in an area of one of said end section and an end of said intermediate section distant from said center section.

25. A mounting system according to claim 11 wherein said first and second rail latch members extend in opposite vertical directions from free ends of a U-shaped base of said support rail; and said first and second device latch members comprise recesses receiving free ends of said first and second latch members, respectively.

26. A mounting system for arranging electrical devices, comprising:

a horizontal mounting strip including a central section, an intermediate section and an end section in a transverse cross section to a longitudinal axis through said mounting strip, said intermediate section being between said central and end sections, said mounting strip having a convex curvature at least in one of said sections thereof; and a support rail coupled to said mounting strip and being attachable to a structure, said end section being spaced apart from said support rail at a greater transverse horizontal first distance from an attachment of said support rail to said intermediate section than an end of said intermediate section close to said support rail, said central section with said support rail being curved outwardly, said mounting strip having a receiver receiving an organizing assembly on at least one free end of said mounting strip distant from said support rail, said organizing assembly receiving connecting lines of said device mounted to said support rail.

* * * * *